(12) United States Patent
Huang

(10) Patent No.: US 10,069,506 B2
(45) Date of Patent: Sep. 4, 2018

(54) CALIBRATION CIRCUIT AND CALIBRATION METHOD FOR DAC

(71) Applicant: REALTEK SEMICONDUCTOR CORPORATION, Hsinchu (TW)

(72) Inventor: Shin-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/475,985

(22) Filed: Mar. 31, 2017

(65) Prior Publication Data

US 2017/0302288 A1    Oct. 19, 2017

(30) Foreign Application Priority Data

Apr. 15, 2016    (TW) .............................. 105111729 A

(51) Int. Cl.
*H03M 1/10* (2006.01)
*H03M 1/46* (2006.01)
*H03M 1/80* (2006.01)

(52) U.S. Cl.
CPC .......... *H03M 1/1061* (2013.01); *H03M 1/466* (2013.01); *H03M 1/804* (2013.01)

(58) Field of Classification Search
None
See application file for complete search history.

(56) References Cited

U.S. PATENT DOCUMENTS

| 7,605,741 | B2 * | 10/2009 | Hurrell | ............... | H03M 1/1047 |
| | | | | | 341/118 |
| 8,378,863 | B2 * | 2/2013 | Ishikawa | ................. | H03M 1/00 |
| | | | | | 341/118 |
| 8,514,114 | B2 | 8/2013 | Kapusta et al. | | |
| 8,981,973 | B2 | 3/2015 | Kumar | | |
| 9,154,152 | B1 * | 10/2015 | Chiu | ...................... | H03M 1/468 |
| 9,432,037 | B2 * | 8/2016 | Oh | ........................... | H03M 1/06 |

FOREIGN PATENT DOCUMENTS

TW    201448479    12/2014

OTHER PUBLICATIONS

Yanfei Chen et al., Split Capacitor DAC Mismatch Calibration in Successive Approximation ADC, IEEE Custom Intergrated Circuits Conference, 2009, pp. 279-282, Japan.
Yan Zhu et al., A 10.4-ENOB 120MS/s SAR ADC with DAC Linearity Calibration in 90nm CMOS,IEEE Asian Solid-State Circuits Conference, 2013, pp. 69-72, Macao, China.

* cited by examiner

*Primary Examiner* — Howard Williams
(74) *Attorney, Agent, or Firm* — WPAT, PC

(57) ABSTRACT

A calibration method for a digital-to-analog converter (DAC) is disclosed. The DAC is applied to a successive approximation analog-to-digital converter (SA ADC) and includes a first capacitor, multiple second capacitors and a bridge capacitor. The method includes the steps of: (a) controlling voltages at two input terminals of a comparator of the SA ADC to be equal; (b) changing a voltage at a first terminal of the first capacitor; (b) obtaining a first output of the SA ADC; (d) after obtaining the first output, controlling voltages at the two input terminals of the comparator to be equal; (e) changing voltages at multiple first terminals of the second capacitors; (f) obtaining a second output of the SA ADC; and (g) calibrating the DAC according to the first output and the second output.

6 Claims, 10 Drawing Sheets

CALIBRATION CIRCUIT AND CALIBRATION METHOD FOR DAC

BACKGROUND OF THE INVENTION

1. Field of the Invention

The present invention relates to a calibration circuit and a calibration method for a digital-to-analog converter (DAC), especially to a calibration circuit and a calibration method for a bridge DAC.

2. Description of Related Art

FIG. 1 illustrates a circuit diagram of a part of a conventional successive approximation analog-to-digital converter (hereinafter referred to as SA ADC). The SA ADC causes the voltages at two input terminals of a comparator 105 to approach each other through a capacitor switching operation of a bridge digital-to-analog converter (DAC) 110 and a comparing operation of the comparator 105. When the voltages approach each other, a successive approximation register (SAR) (not shown) coupled to an output of the comparator 105 generates digital codes according to the outputs of the comparator 105. After all the capacitors of the bridge DAC 110 are switched (i.e., all capacitors are coupled to appropriate voltages), the digital code generated by the SAR is thus regarded as the final output value of the SA ADC, which is the result of an analog-to-digital conversion of the input signal, which comprises Vin and Vip.

The bridge DAC 110 includes two capacitor arrays, each coupled to an input terminal of the comparator 105. Each capacitor array includes a bridge capacitor 130 or 140. In this description, the right side of the bridge capacitor 130 or 140 (i.e., the side close to the comparator 105) is defined as a most significant bit (MSB) side of the capacitor array, and the left side (i.e., the side away from the comparator 105) is defined as a least significant bit (LSB) side of the capacitor array. For example, the MSB side of the capacitor array coupled to a negative terminal of the comparator 105 includes capacitors 111, 112 and 113, whose capacitance values are respectively 4 C, 2 C and 1 C (C being a positive number), and the LSB side includes capacitors 151, 152, 153, 154 and 155, whose capacitance values are respectively 8 C, 4 C, 2 C, 1 C and 1 C. One terminal of the capacitors 111, 112 and 113 is coupled to one end of the bridge capacitor 130 and directly coupled to the comparator 105. One terminal of the capacitors 151, 152, 153, 154 and 155 is not directly coupled to the comparator 105; instead, it is coupled to the other end of the bridge capacitor 130 and then coupled to the comparator 105 through the bridge capacitor 130. The other terminal of the capacitors 111, 112, 113, 151, 152, 153, 154 and 155 that is not coupled to the bridge capacitor 130 is either grounded or coupled to a reference voltage Vref through a switch SW.

For the comparator 105, ideally, all capacitors on the LSB side along with the bridge capacitor 130 or 140 should collectively contribute an equivalent capacitance value that is substantially equal to the capacitance value of the smallest capacitor on the MSB side. However, because of the difficulty in making the bridge capacitor 130 or 140 with a precise desired capacitance value (due to the non-integer capacitance value) and the inevitable parasitic capacitors in the circuit, the bridge DAC 110 is non-ideal, which causes errors in the operations of the SA ADC.

The paper "Split Capacitor DAC Mismatch Calibration in Successive Approximation ADC" (Yanfei Chen, et al., "Split Capacitor DAC Mismatch Calibration in Successive Approximation ADC," Custom Integrated Circuits Conference, 2009. CICC '09. IEEE, pp. 279-282, September 2009) proposed a method for calibrating a bridge DAC. This method, however, must correct the offset of the comparator. The method is applicable only when the offset of the comparator is small enough. Even though the comparator has been calibrated, the practical performance of the bridge DAC is not improved using the calibration method of this paper. Therefore, there is a need to provide a better method and circuit to calibrate a bridge DAC.

SUMMARY OF THE INVENTION

In view of the issues of the prior art, an object of the present invention is to provide a calibration circuit and calibration method to calibrate a bridge digital-to-analog converter (DAC), so as to make an improvement to the prior art.

A method for calibrating a DAC is disclosed. The DAC that is applied to a successive approximation analog-to-digital converter (ADC) by coupling to a comparator thereof comprises a first capacitor, a plurality of second capacitors, and a bridge capacitor. A first terminal of the first capacitor is coupled to a first input terminal of the comparator and a first terminal of the bridge capacitor, and a plurality of first terminals of the second capacitors are mutually coupled and further coupled to a second terminal of the bridge capacitor. The method comprises steps of: (a) controlling a voltage at a second input terminal of the comparator to be equal to a voltage at the first input terminal; (b) changing a voltage at a second terminal of the first capacitor; (c) obtaining a first output of the successive approximation ADC; (d) after the first output is obtained, controlling the voltage at the second input terminal of the comparator to be equal to the voltage at the first input terminal; (e) changing a plurality of voltages at a plurality of second terminals of the second capacitor; (f) obtaining a second output of the successive approximation ADC; and (g) adjusting the DAC according to the first output and the second output.

A circuit for calibrating a DAC is disclosed. The DAC that is applied to a successive approximation analog-to-digital converter (ADC) by coupling to a comparator thereof comprises a first capacitor, a plurality of second capacitors, and a bridge capacitor. A first terminal of the first capacitor is coupled to a first input terminal of the comparator and a first terminal of the bridge capacitor, and a plurality of first terminals of the second capacitors are mutually coupled and further coupled to a second terminal of the bridge capacitor. The circuit comprises a register and a control circuit. The control circuit, which is coupled to the DAC and the register, performs a calibration process. The calibration process comprises steps of: (a) controlling voltages at the first input terminal and a second input terminal of the comparator to be equal; (b) changing a voltage at a second terminal of the first capacitor; (c) storing a first output of the successive approximation ADC to the register; (d) after the first output is obtained, controlling voltages at the first input terminal and the second input terminal of the comparator to be equal; (e) changing a plurality of voltages at a plurality of second terminals of the second capacitors; (f) storing a second output of the successive approximation ADC to the register; and (g) adjusting the DAC according to the first output and the second output.

The calibration circuit and calibration method of this invention calibrate a bridge DAC in a simple manner. As opposed to a conventional calibration method, this invention is not required to correct the offset of the comparator first, so the accuracy and enforceability of calibration can be improved.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events. Further, the calibration method of this invention can be implemented by firmware and/or software and can be carried out by the calibration circuit of this invention.

Figure 1:
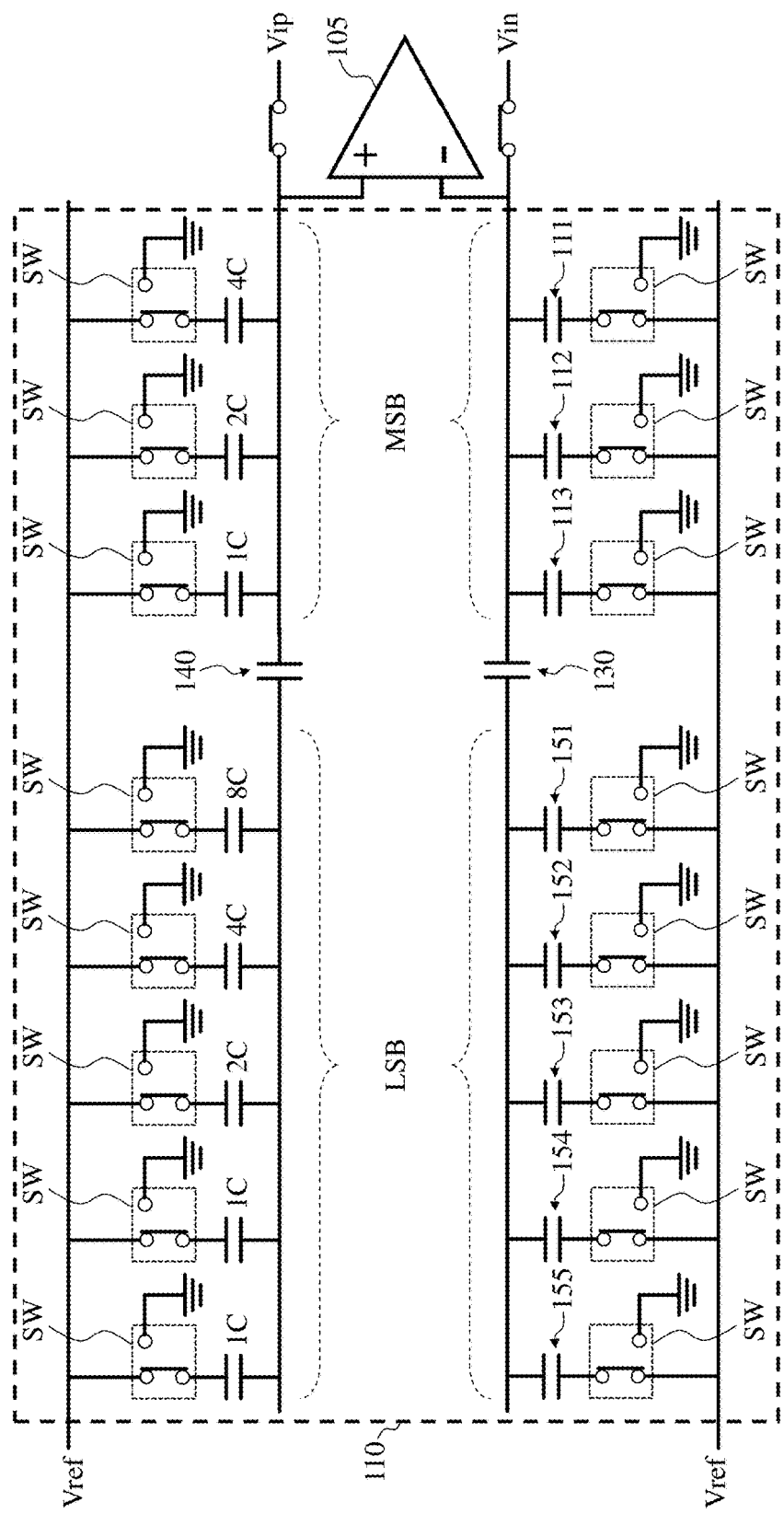
FIG. 1 illustrates a partial circuit diagram of a conventional successive approximation analog-to-digital converter.
Figure 2:
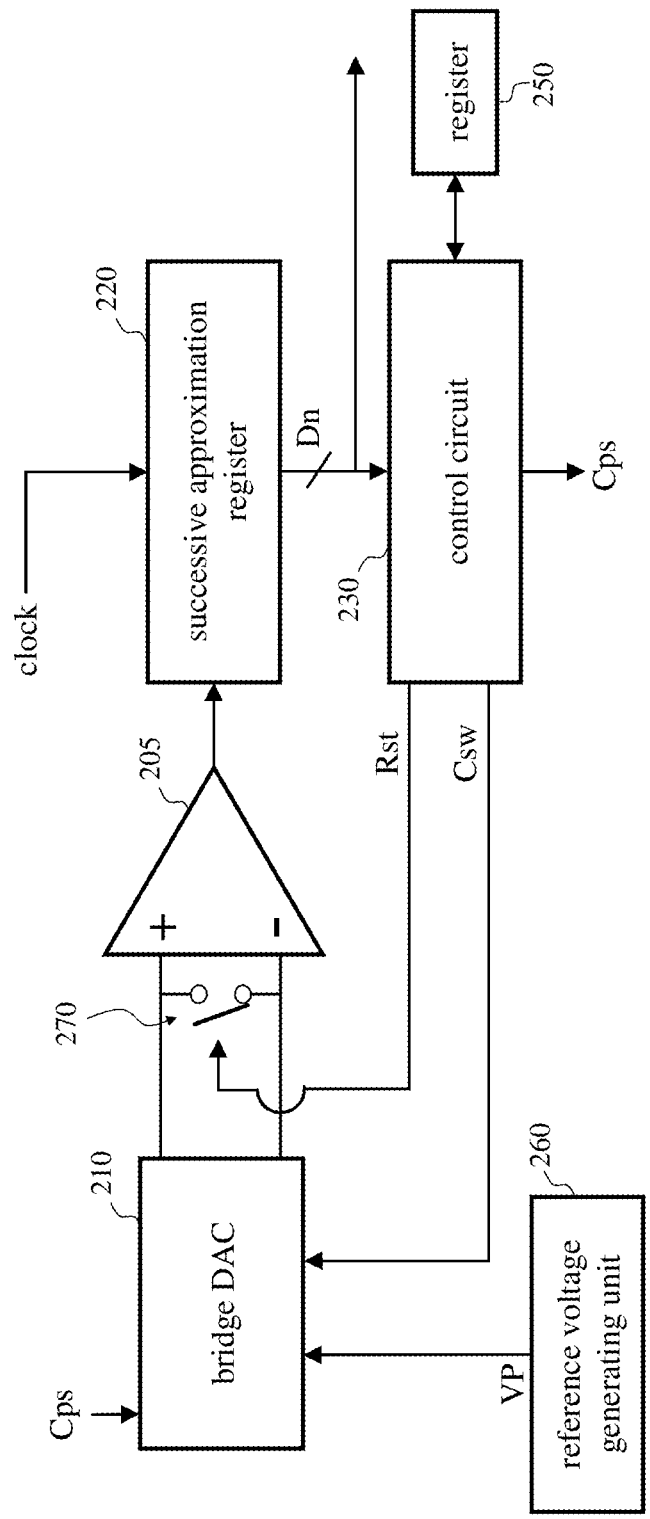
FIG. 2 illustrates a functional block diagram showing a calibration circuit for a bridge digital-to-analog converter (DAC) of this invention coupled to an SA ADC.

FIG. 2 is a functional block diagram showing a calibration circuit for a bridge digital-to-analog converter (DAC) coupled to an SA ADC according to an embodiment of this invention. Please also refer to FIG. 3, which is a flowchart of a calibration method for a bridge DAC according to an embodiment of this invention. Before the calibration starts, the control circuit 230 controls the SA ADC not to receive any input signals, and decides to calibrate either the capacitor array coupled to a positive terminal (i.e., a non-inverting input terminal) of the comparator 205 or the capacitor array coupled to a negative terminal (i.e., an inverting input terminal) of the comparator 205. The calibrating mechanism for a bridge DAC of this invention is set forth below by taking the calibration of the capacitor array coupled to the negative terminal of the comparator 205 as an example. During the calibration of the capacitor array coupled to the negative terminal of the comparator 205, one terminal (the terminal that is not coupled to the bridge capacitor 440 in FIG. 4) of each capacitor of the capacitor array coupled to the positive terminal may remain coupled to the same voltage.

Figure 4A:
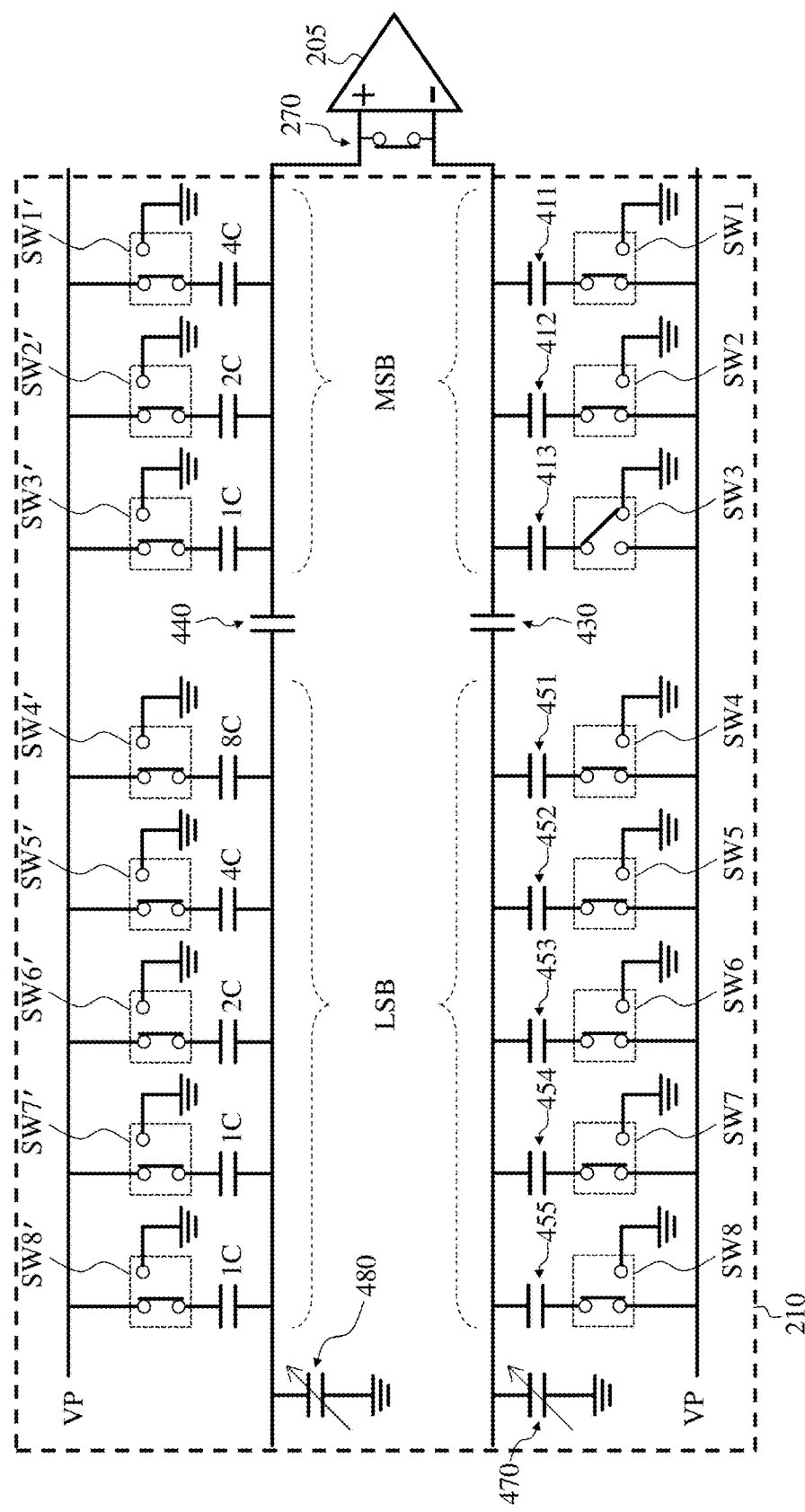
FIGS. 4A~4F illustrate the switching states of the switches of a bridge DAC during the calibration process of this invention.
Figure 4B:
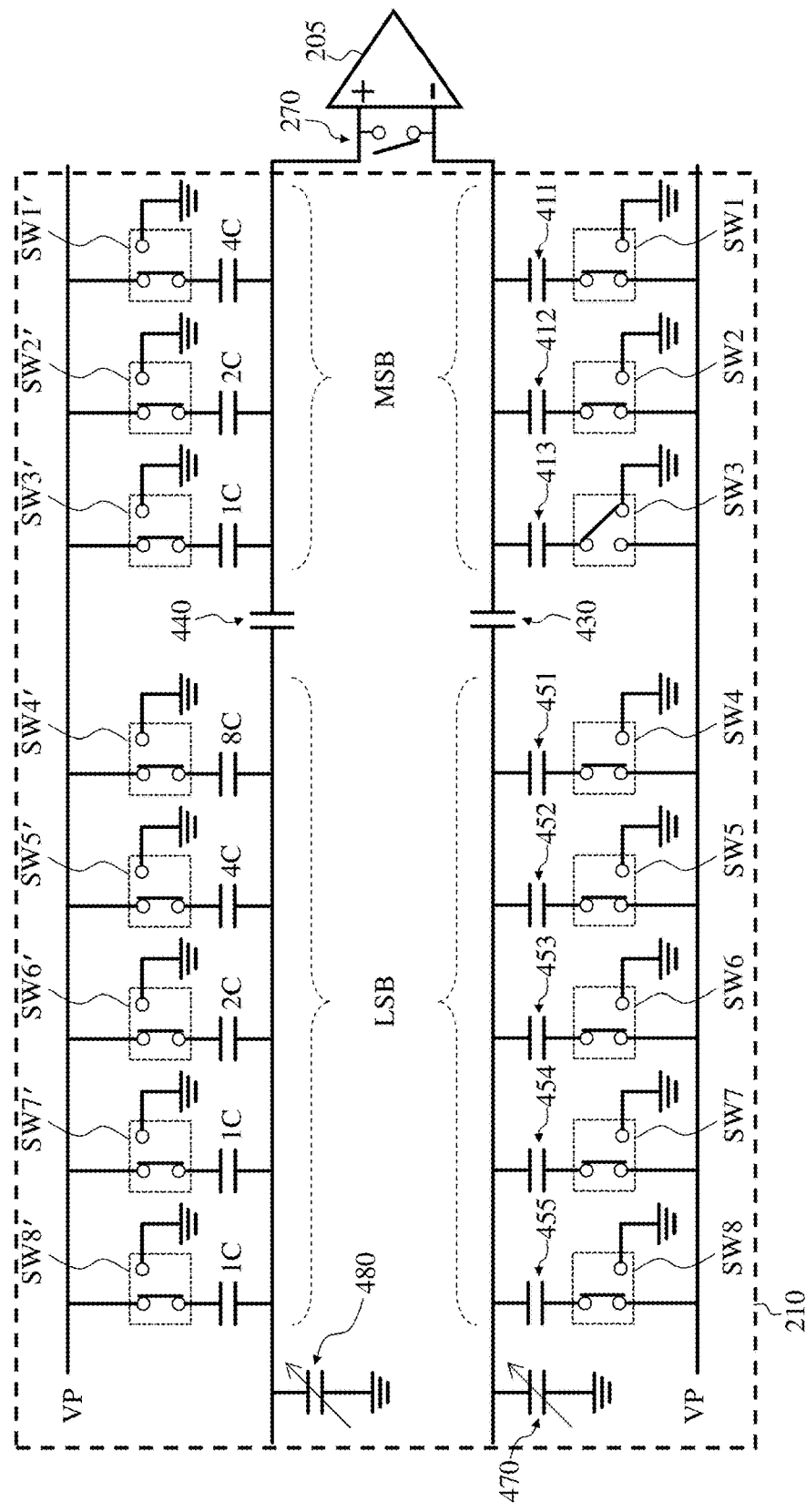

First, the control circuit 230 controls the switch 270 to switch on (the switch 270 being conducted, as shown in FIG. 4A) through the control signal Rst to control the voltages at the positive terminal and the negative terminal of the comparator 205 to be temporarily equal (step S310). Next, the control circuit 230 controls the switch SW3 through the control signal Csw to have one terminal (the terminal not coupled to the bridge capacitor 430) of the smallest capacitor 413 on the MSB side (as shown in FIG. 4A, the capacitance values of the capacitor 411, 412, 413 are assumed to be 4 C, 2 C, 1 C, respectively) coupled to a first voltage (e.g., grounded), and controls the switch SW4~SW8 through the control signal Csw to have one terminal (the terminal not coupled to the bridge capacitor 430) of each capacitor on the LSB side (capacitor 451, 452, 453, 454, 455) coupled to a second voltage (e.g., a high voltage VP in a chip) (step S312). The voltage VP is generated by a reference voltage generating unit 260. It should be noted that the first voltage and the second voltage are different, and in this step, other capacitors on the MSB side (i.e., the capacitor 411 and 412) may be coupled to the first voltage or the second voltage.

Figure 4C:
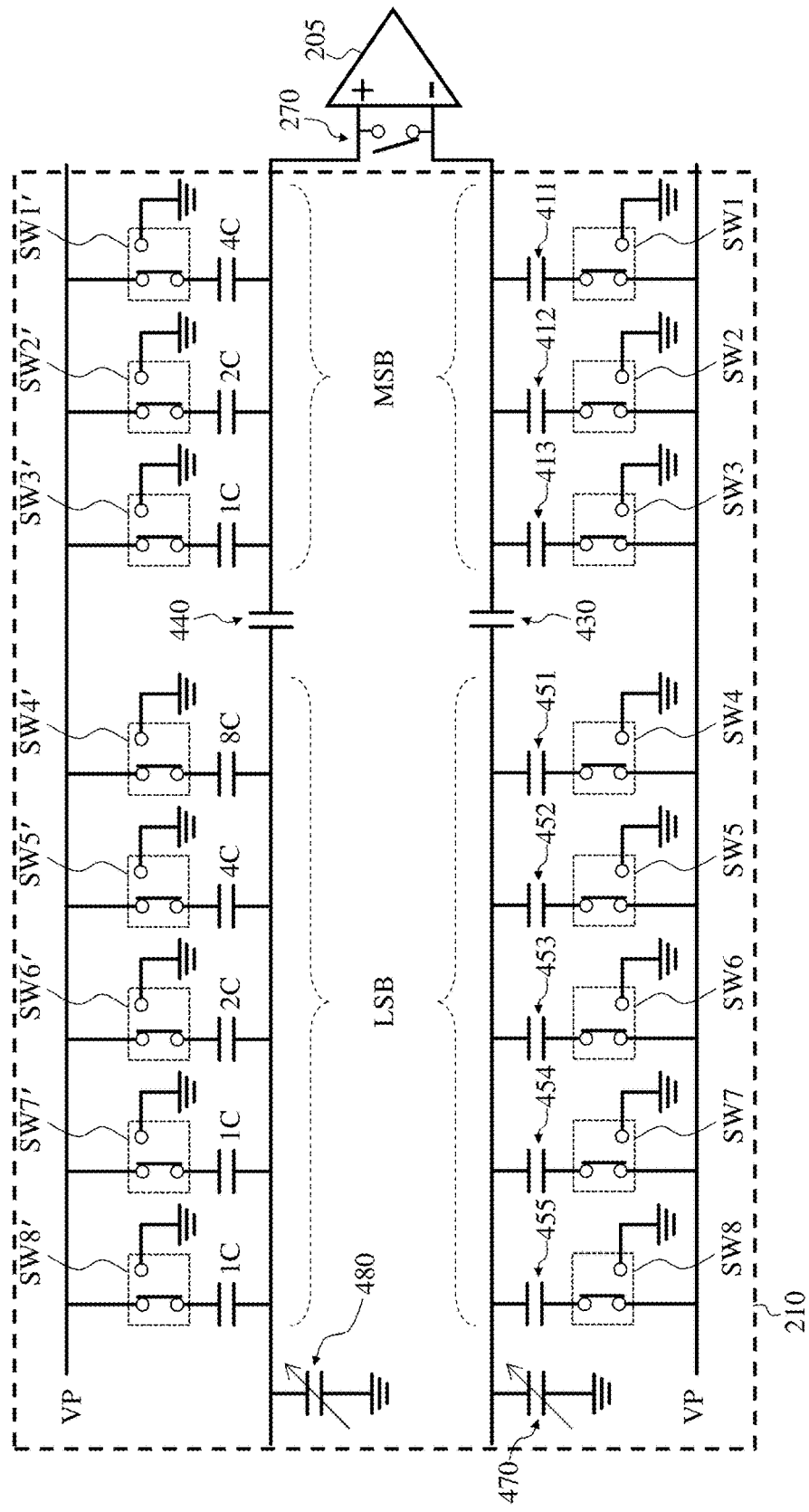
Figure 4D:
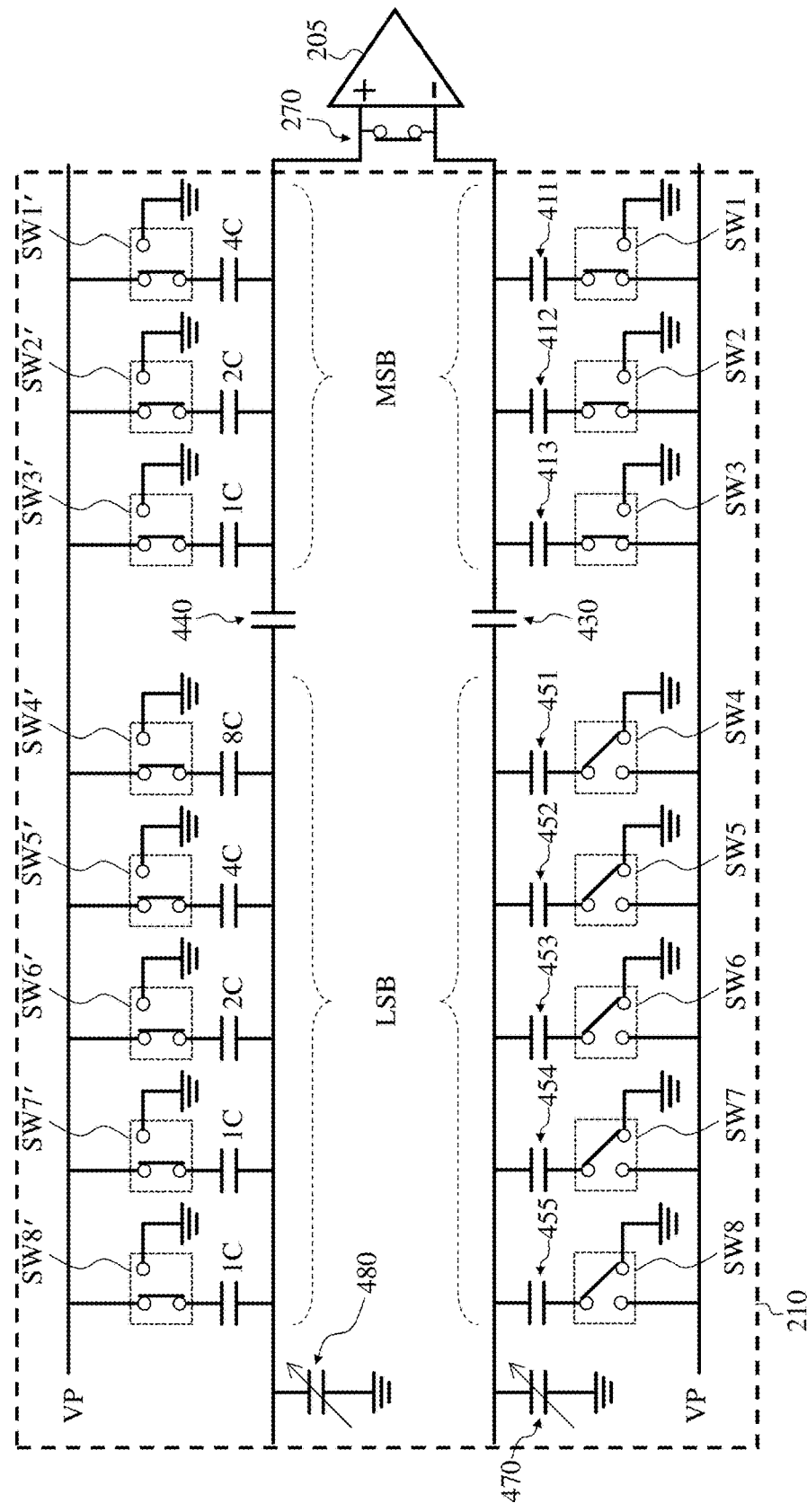
Figure 4E:
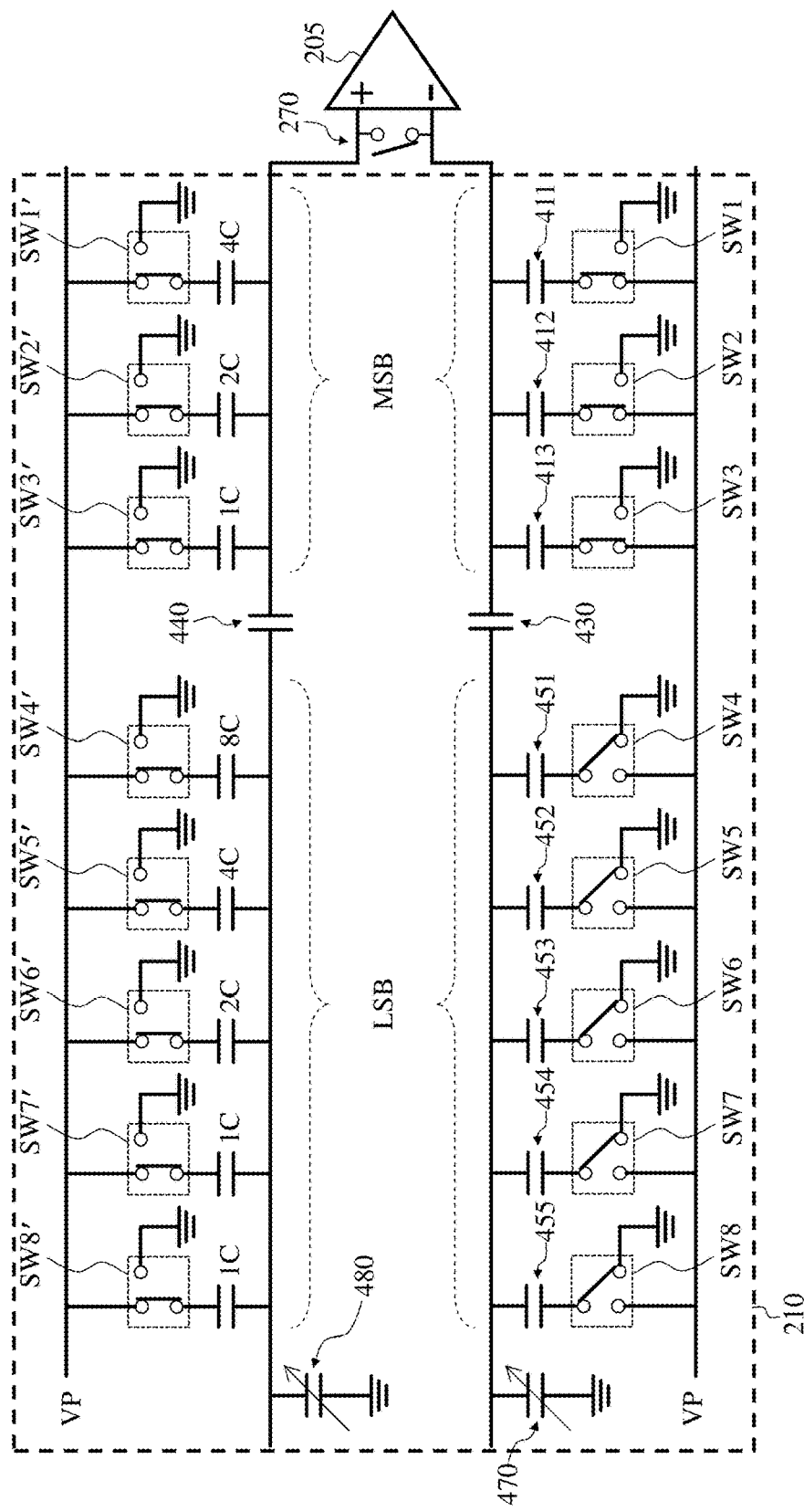
Figure 4F:
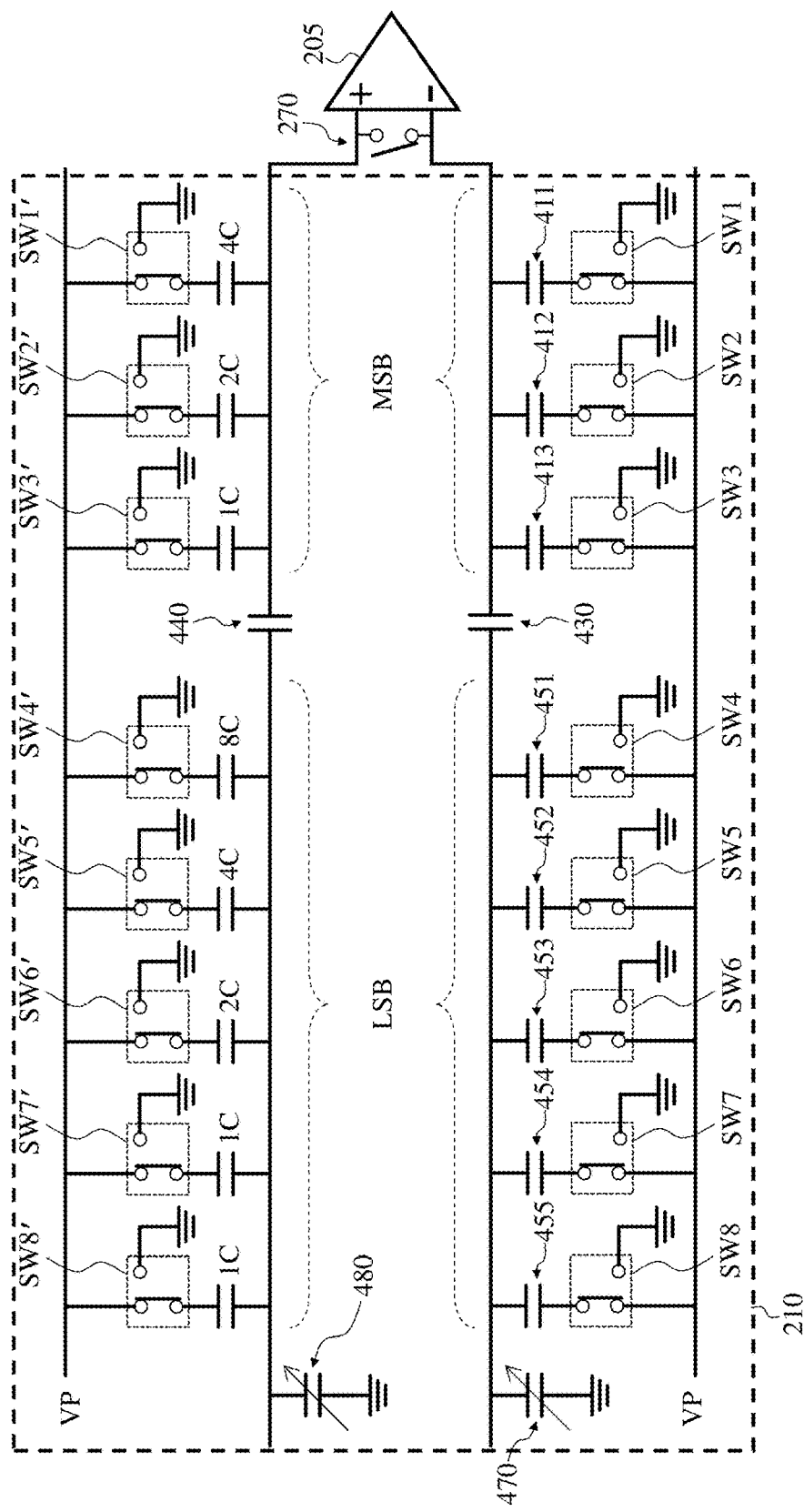

Next, the control circuit 230 first controls the voltages at the positive terminal and the negative terminal of the comparator 205 to become asynchronous (i.e., not held the same) by controlling the switch 270 to switch off (step S314, FIG. 4B), then controls, through the control signal Csw, the voltage to which the smallest capacitor on the MSB side (i.e., capacitor 413) couples to switch from the first voltage to the second voltage (i.e., by controlling, through the control signal Csw, the switch SW3 to switch to have the capacitor 413 coupled to the voltage VP); thus, the change in voltage results in a voltage difference $\Delta V1$ at the negative terminal of the comparator 205 (step S316, FIG. 4C). Next, during several operating cycles of the SA ADC (controlled by a clock signal), the successive approximation register (SAR) 220 generates several digital codes Dn according to the outputs of the comparator 205, and the control circuit 230 decides the switching states of the switches SW4~SW8 (i.e., decides the voltages to which the capacitor 451, 452, 453, 454 and 455 couples) according to the digital codes Dn (step S318). Specifically, this process is an approaching process of the SA ADC, which has N operating cycles (N being the number of capacitors on the LSB side, N=5 in this example), and each operating cycle includes a comparing operation of the comparator 205 and a switching operation of the control circuit 230. In the switching operations, the switching states of the switches SW4~SW8 are sequentially determined. When any of the capacitor 451, 452, 453, 454, 455 is switched from the voltage VP to ground, the voltage at the negative terminal of the comparator 205 decreases accordingly. After the SA ADC reaches a steady state (i.e., these 5 operating cycles are completed and the SA ADC has decided each bit value of its outputted digital code), the control circuit 230 obtains a digital code Dn1 and stores the digital code Dn1 to the register 250. The digital code Dn1 is a digital value that the SA ADC generates by quantizing an overall contribution ($\Delta V1+V_{offset}$) of the voltage difference $\Delta V1$ and the offset of the comparator 205 ($V_{offset}$). Note that the switch SW3 remains coupled to the voltage VP in step S318 under the control of the control circuit 230.

Next, the control circuit 230 controls the switch 270 to switch on through the control signal Rst, making the voltages at the positive terminal and the negative terminal of the comparator 205 become temporarily equal again (step S320). Then the control circuit 230 controls the smallest capacitor on the MSB side (capacitor 413) to be coupled to the second voltage, and controls all capacitors on the LSB side to be coupled to the first voltage (step S322, FIG. 4D). After the charges reach a balance, the control circuit 230 first controls the voltages at the positive terminal and the negative terminal of the comparator 205 to become asynchronous (not held the same) by controlling the switch 270 to switch off (step S324, FIG. 4E). Next, the control circuit 230 controls, through the control signal Csw, the voltage to which all capacitors on the LSB side couple to switch from the first voltage to the second voltage (i.e., by controlling, through the control signal Csw, all switches SW4~SW8 to switch to have the capacitor 451, 452, 453, 454, 455 coupled to the voltage VP); the change in voltage results in a voltage difference ΔV2 at the negative terminal of the comparator 205 (step S326, FIG. 4F). Next, similar to step S318, during several operating cycles of the SA ADC, the SAR 220 generates several digital codes Dn according to the outputs of the comparator 205, and the control circuit 230 decides the switching states of the switches SW4~SW8 according to the digital codes Dn (step S328). Then, after the SA ADC reaches a steady state (i.e., after N operating cycles, N=5 in this example), the control circuit 230 obtains a digital code Dn2 and stores the digital code Dn2 to the register 250. The digital code Dn2 is a digital value that the SA ADC generates by quantizing an overall contribution ($\Delta V2+V_{offset}$) of the voltage difference ΔV2 and the offset of the comparator 205 ($V_{offset}$). Note that the switch SW3 remains coupled to the voltage VP in step S328 under the control of the control circuit 230.

Next, the control circuit 230 compares the digital code Dn1 and the digital code Dn2 (step S330). In fact, comparing the digital code Dn1 and the digital code Dn2 is substantially equivalent to comparing ($\Delta V1+V_{offset}$) and ($\Delta V2+V_{offset}$). As the offset $V_{offset}$ of the comparator 205 can be precluded by comparing the digital code Dn1 and the digital code Dn2, it is not required for the present invention to correct the offset of the comparator 205 before the calibration process. In addition, whether the bridge capacitor 430 and all capacitors on the LSB side collectively contribute an ideal equivalent capacitance value (should be equal to the capacitance value of the smallest capacitor on the MSB side) to the comparator 205 can be readily known by comparing the digital code Dn1 and the digital code Dn2. Then, the control circuit 230 generates an adjusting signal Cps to increase or decrease the compensation capacitor 470 according to the values of the digital code Dn1 and the digital code Dn2 (step S332 or step S334).

Note that the relationship between the bit values (1/0) of the digital code and the switching states of the switches SW1~SW8 (i.e., the voltages to which the capacitors 411~413 and 451~455 couple) should be defined before comparison. If a bit value of "1" in the digital code is defined as a switch SWy from a corresponding pair of switches (SWy, SWy') (1≤y≤8 in this example) being coupled to ground and the other switch SWy' being coupled to the voltage VP (note that a bit value of "0" would have an opposite definition), then the digital code Dn1 being greater than the digital code Dn2 represents that the voltage difference ΔV1 is greater than the voltage difference ΔV2, implying that the equivalent capacitance value on the LSB side observed by the comparator 205 is too small; thus, the equivalent capacitance value of the compensation capacitor 470 should be decreased (step S332); on the contrary, the digital code Dn1 being smaller than the digital code Dn2 represents that the voltage difference ΔV1 is smaller than the voltage difference ΔV2, implying that the equivalent capacitance value on the LSB side observed by the comparator 205 is too large; thus, the equivalent capacitance value of the compensation capacitor 470 should be increased (step S334).

Note that, in cases where the definition of the bit value of the digital code is different, or where the calibrating device and method of the present invention are applied to the positive terminal of the comparator 205, the way the compensation capacitor should be adjusted (increase or decrease) based on the relationship between the two digital codes (Dn1, Dn2) should be modified accordingly. Since people of ordinary skill in the art can appreciate the implementation detail and the modification thereto through the above disclosure, repeated and redundant description is thus omitted. Further, because the voltage difference ΔV1 and the voltage difference ΔV2 are actually reflected on the voltages to which the capacitors on the LSB side couple (i.e., reflected on the switching states of the switches SW4~SW8), the step of comparing the digital code Dn1 and the digital code Dn2 (step S330) can compare only the lowest N bits of the two digital codes.

Figure 3:
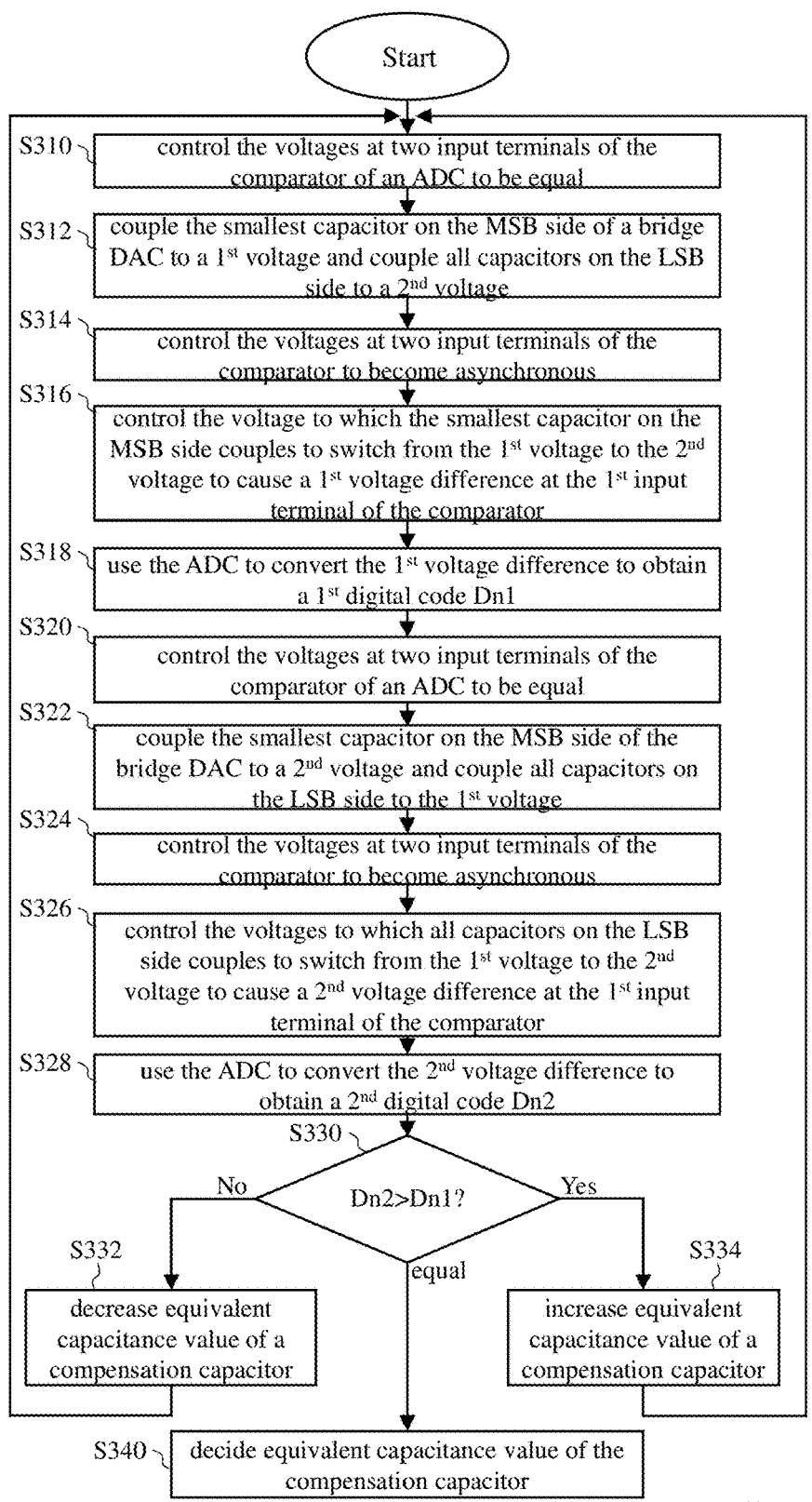
FIG. 3 illustrates a flowchart of a calibration method for a bridge DAC according to an embodiment of this invention.
Figure 5:
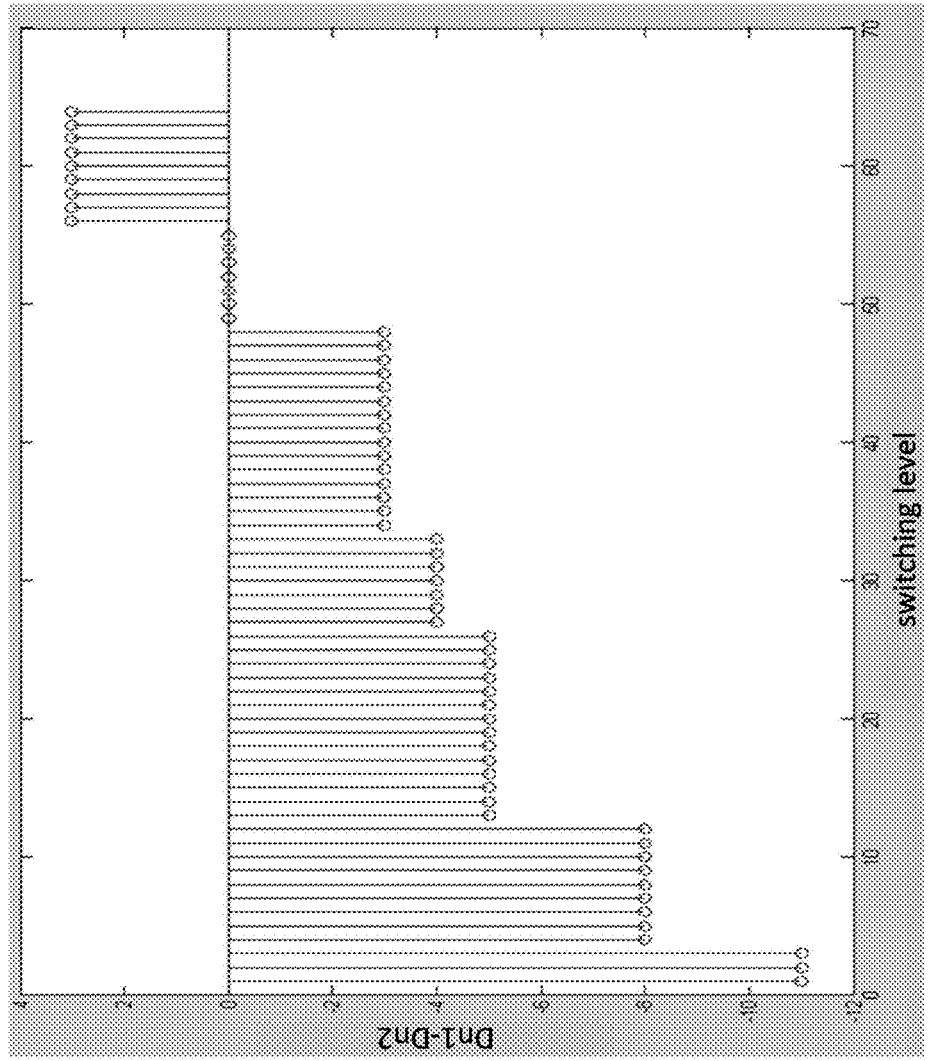
FIG. 5 illustrates a relationship between a difference between the digital codes and the switching levels of the compensation capacitor.

After step S332 or step S334 is completed, steps S310 to S330 are performed again to determine whether the compensation capacitor 470 still needs to be adjusted. After the flowchart of FIG. 3 is performed several times, a relationship between a difference between the digital codes (Dn1−Dn2) and the switching levels of the compensation capacitor is obtained, as shown in FIG. 5. 64 switching levels are presented in FIG. 5. A higher switching level stands for a greater equivalent capacitance value of the compensation capacitor 470. It is observed that the switching levels 49~55 correspond to zero digital code difference (Dn1−Dn2). In other words, if the switching level of the compensation capacitor 470 is set at any switching level between 49 and 55, the capacitors on the LSB side can be effectively compensated, which means that the calibration of the bridge DAC 210 is completed. Therefore, when it is determined that the digital code Dn1 is equal to the digital code Dn2 in step S330, the equivalent capacitance value of the compensation capacitor 470 can be readily decided and the calibration of the bridge DAC 210 is thus completed (step S340).

After examining the effective number of bits (ENOB) of the SA ADC corresponding to the switching levels 49~55, it is found that the SA ADC has a higher ENOB when a switching level closer to the middle of the switching levels 49~55 (52 in this example) is chosen. In other words, although the equivalent capacitance value of the compensation capacitor 470 can be decided after a switching level corresponding to a zero digital code difference (Dn1−Dn2) is chosen in step S340 (i.e., a completion of the calibration process), the process shown in FIG. 3 can be performed for more times to obtain a better calibration result. Specifically, to obtain a better calibration effect, all the switching levels of the compensation capacitor 470 corresponding to zero digital code difference (Dn1−Dn2) are first determined, and then a middle level of the determined switching levels is chosen to set the final equivalent capacitance value of the compensation capacitor 470.

Note that the offset $V_{offset}$ of the comparator 205 is determined to be too large if, in step S318 or step S328, the bits of the digital code Dn1 or the digital code Dn2 corresponding to the capacitors (or switches) on the LSB side of the bridge DAC 210 are all "0" or all "1" (i.e., the digital code being xxx00000 or xxx11111 for the exemplary circuit of FIG. 4). The excessive value of the offset $V_{offset}$ of the comparator 205 causes the digital code Dn1 or the digital code Dn2 to be not able to genuinely reflect the voltage difference ΔV1 or the voltage difference ΔV2. To address this issue, one of the two approaches can be taken: (1) re-performing the calibration process with the first voltage and the second voltage swapped in steps S312, S316, S322 and S326; or (2) swapping the positive and negative terminals of the comparator 205 (i.e., if the calibration process is originally performed on the capacitor array coupled to the negative terminal of the comparator 205, the new calibration process will be performed on the capacitor array couple to the positive terminal of the comparator 205) and performing the flowchart of FIG. 3 again.

In one embodiment where the compensation capacitor 470 includes a plurality of capacitors and a plurality of switches, the switching levels correspond to different switching states of the switches and thus correspond to different equivalent capacitance values. The paper "Split Capacitor DAC Mismatch Calibration in Successive Approximation AD" provides one of the methods of implementing a compensation capacitor 470.

Please note that there is no step sequence limitation for the method inventions as long as the execution of each step is applicable. Furthermore, the shape, size, and ratio of any element and the step sequence of any flow chart in the disclosed figures are exemplary for understanding, not for limiting the scope of this invention. Moreover, this invention is not limited to SA ADC, but can also be applied to other types of ADC.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A circuit for calibrating a digital-to-analog converter (DAC), said DAC being applied to a successive approximation analog-to-digital converter (ADC) and coupled to a comparator of said successive approximation ADC, said DAC comprising a first capacitor, a plurality of second capacitors, and a bridge capacitor, a first terminal of said first capacitor being directly coupled to a first input terminal of said comparator and a first terminal of said bridge capacitor, and a plurality of first terminals of said second capacitors being mutually coupled and coupled to a second terminal of said bridge capacitor, said circuit comprising:
   a register; and
   a control circuit, coupled to said DAC and said register, for performing a calibration process, said calibration process comprising steps of:
      (a) controlling voltages at said first input terminal and a second input terminal of said comparator to be equal;
      (b) changing a voltage at a second terminal of said first capacitor from a first voltage to a second voltage;
      (c) storing a first output of said successive approximation ADC to said register;
      (d) after said first output is obtained, controlling voltages at said first input terminal and said second input terminal of said comparator to be equal;
      (e) changing all voltages at all second terminals of said second capacitors from said first voltage to said second voltage;
      (f) storing a second output of said successive approximation ADC to said register;
      (g) adjusting said DAC according to said first output and said second output;
      (h) determining whether lowest K bits of said first output or said second output are identical, K being the number of said second capacitors; and
      (i) when said lowest K bits of said first output or said second output are identical, performing step (a) to step (g) again;
   wherein, in step (b) said control circuit switches said second terminal of said first capacitor from said second voltage to said first voltage, and in step (e) said control circuit switches said second terminals of said second capacitors from said second voltage to said first voltage.

2. The circuit of claim 1, wherein in step (a) said control circuit controls said second terminal of said first capacitor to be coupled to said first voltage, and controls said second terminals of said second capacitors to be coupled to said second voltage, and in step (d) said control circuit controls said second terminals of said second capacitors to be coupled to said first voltage, and controls said second terminal of said first capacitor to be coupled to said second voltage.

3. The circuit of claim 1, wherein said control circuit performs the following actions when performing step (c) or step (f):
   selectively changing voltages at said second terminals of said second capacitors according to an output of said successive approximation ADC; and
   using said output of said successive approximation ADC as said first output or said second output after said successive approximation ADC has determined each bit value of said output.

4. The circuit of claim 1, wherein said circuit further comprises a switch, coupled to said first input terminal and said second input terminal of said comparator and said control circuit, and said control circuit controls said switch to switch on when performing step (a) or step (d), and controls said switch to switch off before performing step (b) or step (e) to make voltages at said first input terminal and at said second input terminal of said comparator become asynchronous.

5. A circuit for calibrating a digital-to-analog converter (DAC), said DAC being applied to a successive approximation analog-to-digital converter (ADC) and coupled to a comparator of said successive approximation ADC, said DAC comprising a first capacitor, a plurality of second capacitors, and a bridge capacitor, a first terminal of said first capacitor being directly coupled to a first input terminal of said comparator and a first terminal of said bridge capacitor, and a plurality of first terminals of said second capacitors being mutually coupled and coupled to a second terminal of said bridge capacitor, said circuit comprising:
   a register; and
   a control circuit, coupled to said DAC and said register, for performing a calibration process, said calibration process comprising steps of:
      (a) controlling voltages at said first input terminal and a second input terminal of said comparator to be equal;
      (b) changing a voltage at a second terminal of said first capacitor from a first voltage to a second voltage;
      (c) storing a first output of said successive approximation ADC to said register;
      (d) after said first output is obtained, controlling voltages at said first input terminal and said second input terminal of said comparator to be equal;
      (e) changing all voltages at all second terminals of said second capacitors from said first voltage to said second voltage;
      (f) storing a second output of said successive approximation ADC to said register; and
      (g) adjusting said DAC according to said first output and said second output;

wherein said first output and said second output are digital values, and said control circuit calibrates said DAC by comparing lowest K bits of said first output and said lowest K bits of said second output, K being the number of said second capacitors.

6. A circuit for calibrating a digital-to-analog converter (DAC), said DAC being applied to a successive approximation analog-to-digital converter (ADC) and coupled to a comparator of said successive approximation ADC, said DAC comprising a first capacitor, a plurality of second capacitors, and a bridge capacitor, a first terminal of said first capacitor being directly coupled to a first input terminal of said comparator and a first terminal of said bridge capacitor, and a plurality of first terminals of said second capacitors being mutually coupled and coupled to a second terminal of said bridge capacitor, said circuit comprising:

a register; and a control circuit, coupled to said DAC and said register, for performing a calibration process, said calibration process comprising steps of:

(a) controlling voltages at said first input terminal and a second input terminal of said comparator to be equal;

(b) changing a voltage at a second terminal of said first capacitor from a first voltage to a second voltage;

(c) storing a first output of said successive approximation ADC to said register;

(d) after said first output is obtained, controlling voltages at said first input terminal and said second input terminal of said comparator to be equal;

(e) changing all voltages at all second terminals of said second capacitors from said first voltage to said second voltage;

(f) storing a second output of said successive approximation ADC to said register; and (g) adjusting said DAC according to said first output and said second output;

wherein in step (b) said control circuit generates a first voltage difference at said first input terminal of said comparator, in step (e) said control circuit generates a second voltage difference at said first input terminal of said comparator, said DAC further comprises a compensation capacitor coupled to said second terminal of said bridge capacitor, and said control circuit performs the following actions when performing step (g):

increasing an equivalent capacitance value of said compensation capacitor when said first output and said second output indicate that said second voltage difference is greater than said first voltage difference; and decreasing said equivalent capacitance value of said compensation capacitor when said first output and said second output indicate that said second voltage difference is smaller than said first voltage difference.

* * * * *